United States Patent [19]

Luhramann

[11] Patent Number: 5,231,603
[45] Date of Patent: Jul. 27, 1993

[54] VARIABLE PAGE ROM

[75] Inventor: Craig J. Luhramann, Bayville, N.Y.

[73] Assignee: Microchip Technology Incorporated, Chandler, Ariz.

[21] Appl. No.: 134,964

[22] Filed: Dec. 18, 1987

Related U.S. Application Data

[62] Division of Ser. No. 757,337, Jul. 22, 1985, Pat. No. 4,744,053.

[51] Int. Cl.[5] .................. G11C 15/00; G11C 8/00
[52] U.S. Cl. ........................... 365/189.03; 365/49; 365/63; 365/238.5
[58] Field of Search ............ 365/49, 94, 104, 189, 365/235, 230, 238.5, 189.03, 51, 63; 437/48, 52

[56] References Cited

U.S. PATENT DOCUMENTS

| | | | |
|---|---|---|---|
| 3,518,631 | 6/1970 | Lindquist et al. | 365/49 |
| 4,021,781 | 5/1977 | Caudel | 365/203 |
| 4,234,761 | 11/1980 | Wiggins et al. | 365/45 |
| 4,480,320 | 10/1984 | Naiff | 365/104 |
| 4,575,825 | 3/1986 | Ozaki et al. | 365/235 |
| 4,675,849 | 6/1987 | Kinoshita | 365/200 X |
| 4,744,053 | 5/1988 | Luhrmann | 365/49 |

Primary Examiner—Joseph A. Popek
Attorney, Agent, or Firm—Leitner, Greene & Christensen

[57] ABSTRACT

The same basic ROM circuit may be used to provide memories of increased capacity for pre-existing systems having different fixed numbers of address inputs. The appropriate page configuration is selected to accommodate the number of address inputs in the system. The system is adapted to generate a page address signal having the required number of bits on the data bus. The selected page configuration is obtained by mask programming the address decoder and input buffer circuits. The page address signal from the data bus is routed through the data transfer buffers and stored in a RAM for use in conjunction with the row and column address inputs.

8 Claims, 3 Drawing Sheets

VARIABLE PAGE ROM

This is a divisional of co-pending application Ser. No. 757,337 filed on Jul. 22, 1985, now U.S. Pat. No. 4,744,053.

The present invention relates to read only memories (ROM's) and, more particularly, to a read only memory which has a mask programmable page configuration.

A read only memory is a data storage device which consists of a matrix array of data storage units, such as switches or transistors, which can be individually accessed and read to determine their state ("on" or "off", operable or inoperable). Various peripheral circuits are required in order to access and read the storage devices. These circuits include address signal input circuits, address signal decoding circuits, and data transfer circuits.

Address signals are applied in parallel to the address inputs of an input buffer. If, for example, the address input signal has 17 bits, the input buffer will have 17 address inputs, each connected to receive a different bit of the address signal. The address circuitry includes a row address decoder and a column address decoder, both of which receive parallel inputs from the input buffer circuit. In accordance with these inputs, the decoder circuits select a particular storage unit from the matrix.

The selected storage unit is read to determine its state which is reflected by either a high or low voltage on an output line. Parallel output lines, one for each column, are connected to an output buffer circuit which, in turn, applies a parallel output signal to a data bus.

The data is programmed into the memory during the fabrication process. Since different data need be programmed into the memories for different applications, it is advisable that the fabrication process be the same for all of the memories of a given type, except for the step during which the information is programmed.

Read only memories are formed on semiconductor chips through the process of layering the chip surface and then etching selected portions of the layers. The portions to be etched are selected by masking the surface through the use of well known processes. The storage unit matrix is programmed through the use of masks and, thus, different masks are utilized to program different information. Information is stored in the memory by physically creating operable or inoperable devices at intersections of the matrix. Once programmed, it cannot be changed, unlike electronically programmable memories which can be erased, either in bulk such as through the use of ultraviolet light or by erasing each unit individually, and reprogrammed.

Mass production of read only memories with different programming is only possible because the structure of the memory matrix and peripheral circuitry is the same for all memories of a given type, regardless of the information to be programmed therein. Otherwise, a different structure would have to be developed for each program, making production costs prohibitive.

When a read only memory is designed, the configuration of the matrix array and the structure of the peripheral circuitry are designed to be compatible. For example, a matrix array of a given size requires a given number of address inputs which must be decoded in a particular manner. If the size or shape (numbers of rows and columns) of the memory matrix is altered, the address circuitry and input circuitry must be correspondingly altered.

Advancing technology has permitted memories of greater capacity to be fabricated. Higher capacity memories have more densely packed matrix arrays of storage units which require less space per unit. Such matrix arrays require larger numbers of address inputs. For example, quadrupling the capacity of the array normally requires twice as many address inputs.

The number of address inputs can be reduced, without loss of capacity, if the memory array is organized into sub-arrays and addressed accordingly. For example, a 4K array of storage units may require ten address inputs—five for the row decoder and five for the column decoder. A 16K array would normally require twice as many address inputs, totalling 20—ten for the row decoder and ten for the column decoder. However, if the 16K array is considered to be four separate 4K sub-arrays, each individually addressable, only a two digit code and, thus, two address inputs, are required to select the proper sub-array. Therefore, only twelve address inputs are required—ten to select the necessary row and column and two to select the necessary sub-array upon which the selected row and column is present. Dividing the array into sub-arrays is a way in which the number of address inputs may be reduced.

Such sub-arrays can be referred to as blocks or banks of storage units, but are most often called "pages" throughout the industry. The process of organizing a matrix array into pages is called "pagination". Random access memories with various page configurations are known. However, because the particular page configuration selected is dependent upon the number of address inputs which are available, and vice versa, different memory designs and peripheral circuit configurations are required for different page configurations.

Increased memory capacity means that additional memory may be obtained in the same size chip. For example, modern 8K read only memory chips can replace older 4K read only memory chips. However, in previously existing systems, which have a fixed number of address inputs, a different ROM design, including a paginated storage array, is required if the higher capacity chip is to be substituted for the previously used memory.

A good example of an increased capacity ROM designed so that it can be used with pre-existing systems having fixed numbers of address inputs is disclosed in U.S. Pat. No. 4,368,515 to Nielsen issued Jan. 11, 1983 entitled "Bank Switchable Memory System." The Nielsen circuit, however, requires a different circuit configuration for each pagination. Thus, different circuits must be designed and developed for use in different pre-existing systems which have different numbers of address inputs.

From the viewpoint of the semiconductor manufacturer, it is advantageous to design and fabricate a single read only memory which can be used for the widest possible variety of applications. Previously, however, each circuit had to be designed and developed individually in accordance with each pagination configuration and address input number. In general, the present invention overcomes this problem through the utilization of a single basic read only memory circuit which is mask programmable to provide a selected one of a variety of different page configurations and, thus, accommodate different numbers of address inputs. This is a great savings in cost because the same basic circuit design can be used for a large variety of applications, simply by utilizing the appropriate pagination masking.

Certain problems arise in the design of a read only memory capable of use as increased capacity memory substitutes in various pre-existing systems. Different pre-existing systems have different numbers of address inputs. The number of address inputs cannot be changed. Therefore, the read only memory, if it is to be used for different pre-existing systems, must be able to accommodate different numbers of address inputs.

Each storage array configuration requires a given number of address inputs. If all of these inputs can be supplied by the regular row and column address inputs from the system, no pagination is required. However, if less than the required number of inputs are available from the system through the regular address lines, pagination is required as is a page address signal. The number of required bits in the page address signal is related to the page configuration. Since the page address signal is not available on the regular address inputs, some other way of routing the page address signal to and within the ROM is required.

In the present invention, the page address signal originates at the microprocessor of the system and is applied to the data bus. During the presence of a control signal, the page address signal bits are routed from the data bus to the decoder circuitry.

Once received, the page address signal bits must be preserved in the read only memory for a time equal to the access time to read the desired number of locations on the designated page and, thereafter, erased. Conventional read only memories have no facility for the temporary storage of address signals.

In general, the present invention utilizes a mask programmable decoder in order to define the page configuration. A mask programmable input buffer circuit is utilized to block unused row and column address signal paths. The page address signal is generated by the system and is applied to the data bus. This signal is transferred from the data bus to the decoder, in the presence of a control signal, through an input/output buffer circuit. The page address signal is temporarily stored by the decoder through the use of a latch in the form of a random access memory.

It is, therefore, a prime object of the present invention to provide an increased capacity ROM which can be used in pre-existing systems having fixed numbers of address inputs.

It is another object of the present invention to provide an increased capacity ROM with a mask programmable page configuration.

It is another object of the present invention to provide a variable page read only memory which includes mask programmable address circuitry.

It is another object of the present invention to provide a variable page read only memory which includes input buffer means which are mask programmable to disconnect selected row and column address inputs.

It is another object of the present invention to provide a variable page read only memory wherein a page address signal applied to the data bus is routed through the data transfer circuitry to the address circuitry.

It is another object of the present invention to provide a variable page read only memory which includes a means for temporarily storing the page address signal.

It is another object of the present invention to provide a variable page read only memory which is relatively inexpensive to produce and can be fabricated utilizing conventional fabrication techniques.

In accordance with one aspect of the present invention, a read only memory is provided comprising a matrix array of data storage means, address input means, and data bus means. Means are operably connected to the input means and the matrix for addressing individual data storage means in accordance with an address signal. Means, operably connected to the matrix, are provided for transferring data from the addressed data storage means to the data bus means. The address means comprises address decode means, mask programmable into a selected one of several configurations. Each of the configurations defines one or more sub-arrays of data storage means. Each of the sub-arrays is separately addressable in accordance with said address signal.

The address signal includes row and column address signals and a sub-array address signal. The sub-array address signal is received on the data bus. The data transfer means includes means, effective in response to a control signal, for operably connecting the data bus means and the address means.

The input means preferably comprises address inputs adapted to receive the row and column address signals and means, normally operably connecting the inputs and the address means. The input means is mask programmable into one of a plurality of configurations. Each of the configurations disconnects selected ones of the inputs from the address means.

The address means further comprises means for storing the page sub-array address signal. The address signal storage means preferably comprises latching means. The latching means preferably comprises a random access memory.

In accordance with another aspect of the present invention, a read only memory is provided comprising address input means and address means. A matrix array of data storage means is provided. Data transfer means and data bus means are also provided. The address means is operably connected between the address input means and the matrix. The data transfer means are operably connected between the matrix and the data bus means. The data transfer means comprises means, effective in response to a control signal, to operably connect the data bus means and the address means to transfer address signals on the data bus means to the address means.

The address means preferably comprises mask programmable address signal decode means. The address means further comprises address signal storage means. The address signal storage means preferably comprises a random access memory. The address storage means is operably connected to the data transfer means.

The address signal decode means is programmable into different configurations, Each of the configurations organizes the data storage means into one or more sub-arrays which are separately addressable in accordance with the address signals. Each of the configurations preferably organizes the data storage means into equal sized sub-arrays.

The address input means preferably comprises a plurality of address inputs and means, normally operably connecting each of the inputs to the address means. The input means is mask programmable into different configurations. Each of the configurations disconnects selected ones of the inputs from the address means.

In accordance with another aspect of the present invention, a read only memory is provided comprising address signal input means and address means. A matrix array of data storage means are provided as are data transfer means and data bus means. The address means is operably connected between the input means and the matrix. The data transfer means is operably connected between the matrix and the data bus means. The address means preferably comprises address signal storage means and address signal decode means. The address signal storage means is operably connected to receive and temporarily store address signals for the address signal decode means.

The data transfer means preferably comprises means for operably connecting the data bus means and the address signal storage means. Means are also provided for operably connecting the input means and the address signal storage means.

The address signal storage means preferably comprises latch means in the form of a random access memory. The address signal decode means comprises a portion which is mask programmable into different configurations. Each of the configurations organizes the data storage means into sub-arrays which are separately addressable in accordance with the address signals.

To these and to such other objects which may hereinafter appear, the present invention relates to a variable page read only memory, as described in detail in the following specification and recited in the annexed claims, taken together with the accompanying drawings, wherein like numerals refer to like parts, and in which:

The present invention relates to a ROM circuit including a matrix array of storage devices and peripheral circuitry. The peripheral circuitry includes address circuitry and data transfer circuitry. The ROM circuit can be adapted for use in a variety of pre-existing systems, such as electronic games and information retrieval systems, having different fixed numbers of address inputs, through mask programming. The address circuitry, including the decoder circuit and the input buffer circuit can be mask programmed to define various page configurations of the matrix array so as to accommodate pre-existing systems with different numbers of address inputs. The systems are adapted to provide a page address signal on the data bus, in the presence of a command signal. The page address signal is routed through the data transfer circuitry to a storage device where it is retained during use. Preferably, the temporary storage device includes a latching circuit, in the form of a random access memory (RAM).

Figure 1:
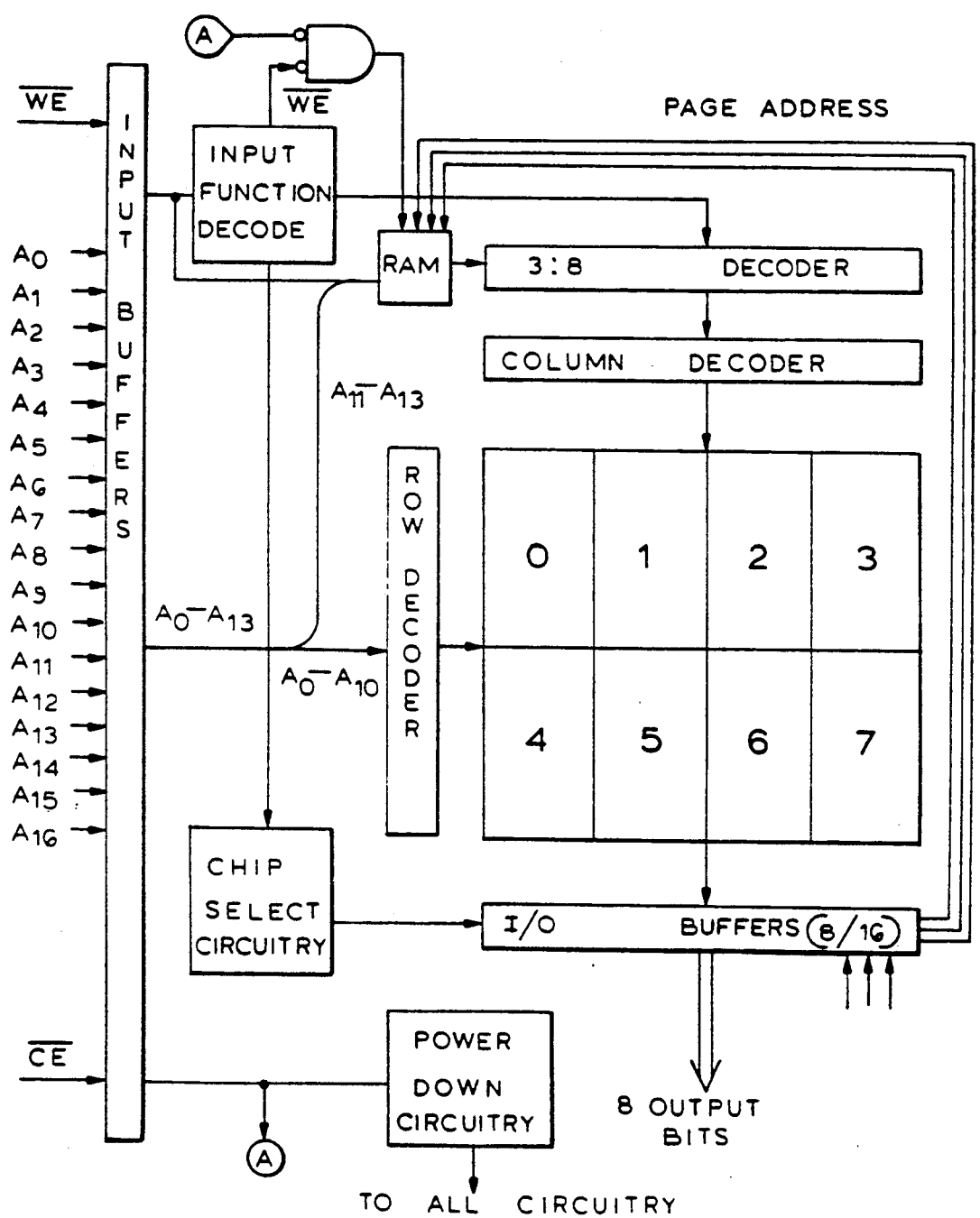
FIG. 1 is a block diagram of the variable page read only memory of the present invention mask programmed into an eight page configuration.
Figure 2:
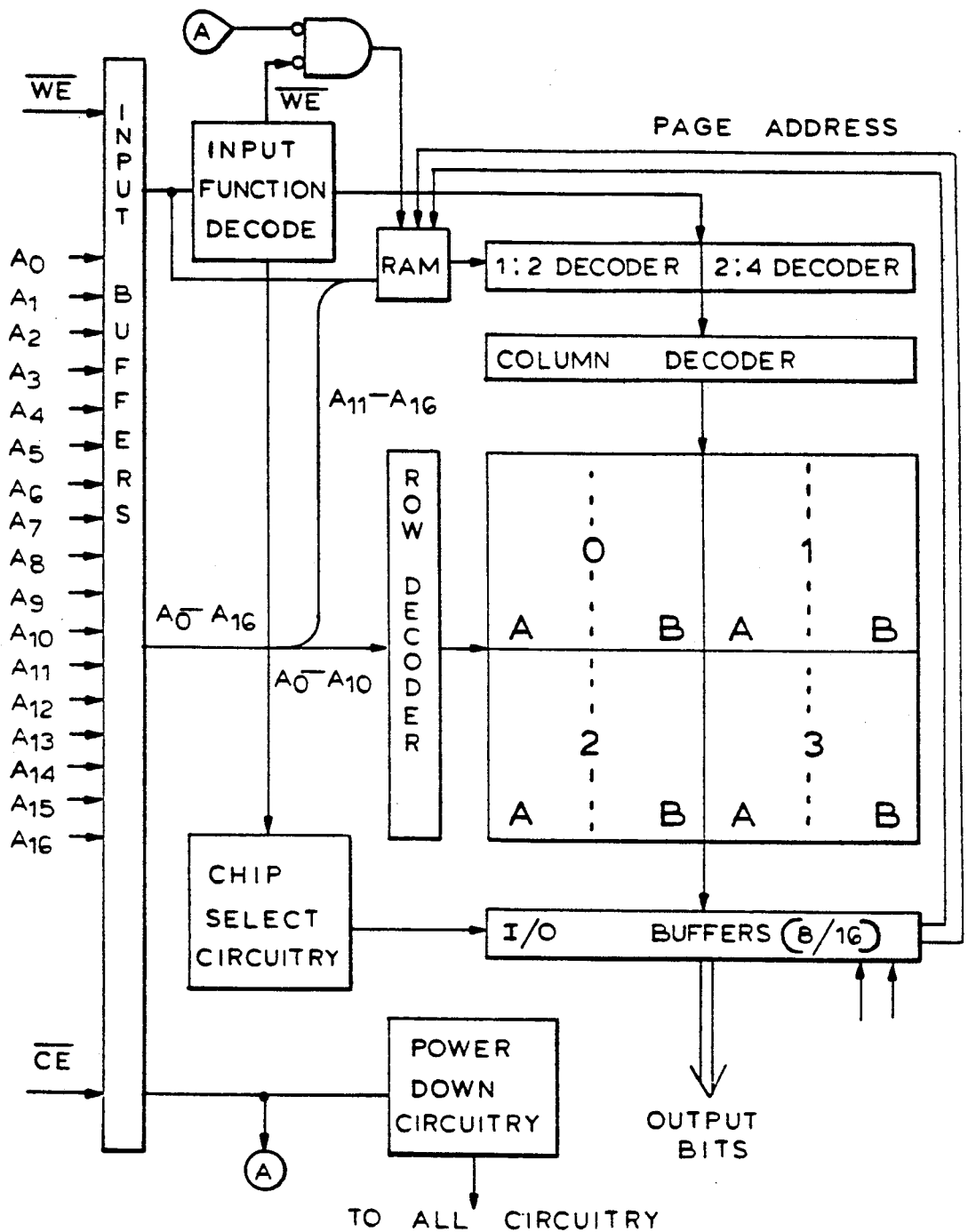
FIG. 2 is a block diagram of the variable page read only memory of the present invention mask programmed into a four page configuration.
Figure 3:
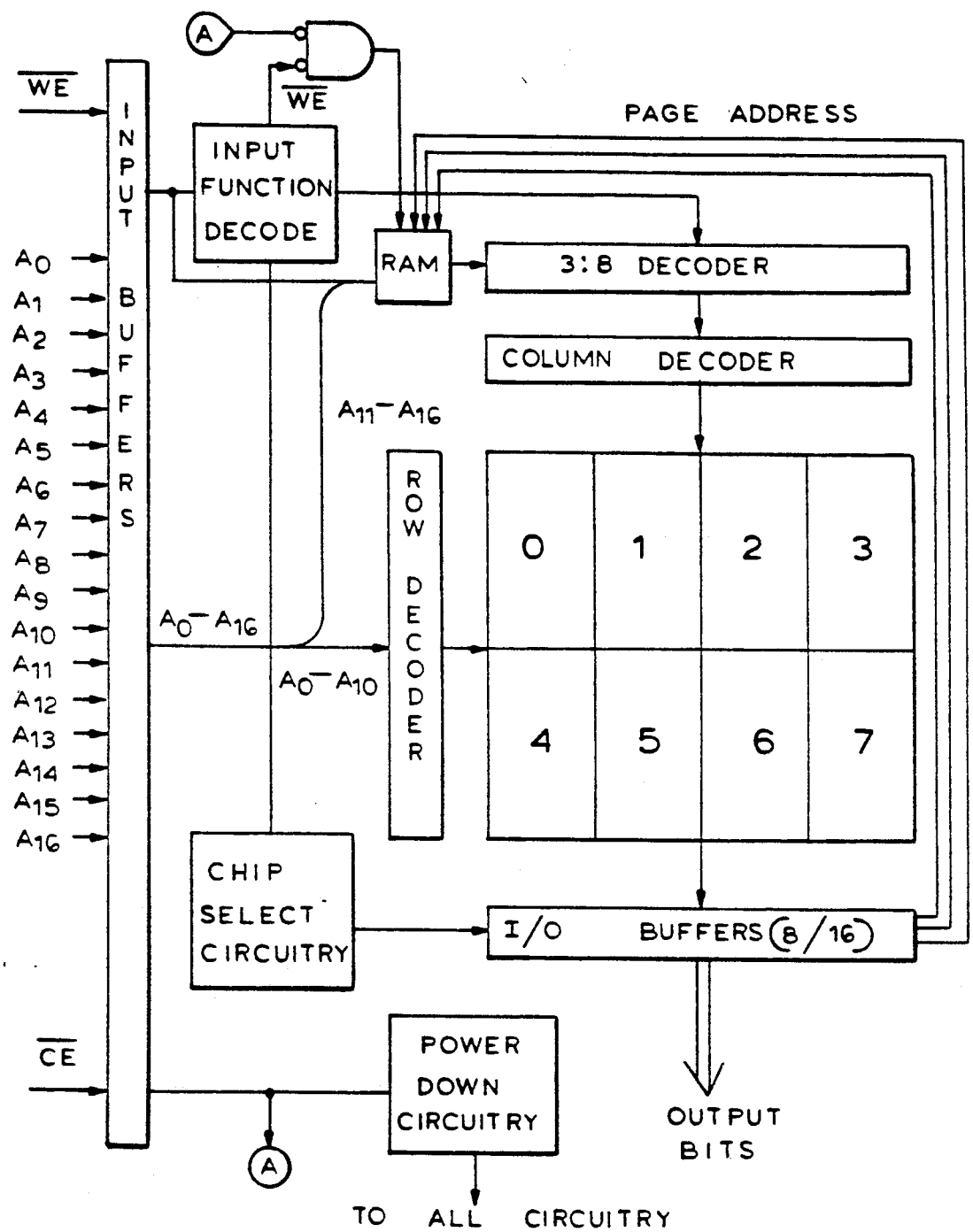
FIG. 3 is a block diagram of the variable page read only memory of the present invention mask programmed into a single page configuration.

FIGS. 1, 2, and 3 are block diagrams of the circuit of the present invention mask programmed for three different page configurations, namely, eight pages of 128K bits each, four pages of 256K bits each, and a single page of 1 KK bits, respectively. However, it is to be understood that the illustrated paging configurations constitute examples of a larger variety of different possible paging configurations and are not to be considered a limitation on the present invention. These paging configurations are illustrated for purposes of explanation only.

Each of the figures illustrates the circuit of the present invention as including a 1 KK bit matrix array of storage devices, generally designated A, preferably manufactured using a CMOS silicon gate process. The array is designed such that its output configuration is programmable. ROM A can generate either 8-bit or 16-bit output words through the data transfer circuit, generally designated B, which is connected thereto. The data transfer circuit B contains the required number of output buffers and controls the length of the output word. Data transfer circuit B is connected to the data bus 10. Data bus 10 serves to route data accessed from ROM A to the microprocessing unit of the system in which the circuit is employed. Data bus A also functions as an input for the page address signal generated by the microprocessing unit of the system, as explained below.

The storage devices in ROM A are addressed by address circuitry which includes a conventional row decoder 12, a conventional column decoder 14, and a mask programmable page decoder 16. Row decoder 12 has, for example, ten outputs connected in parallel to each of the eight 128K pages in ROM A, designated on FIG. 1 as: "0, 1, 2, 3, 4, 5, 6, and 7". Similarly, column decoder 14 has, for example, eight outputs connected in parallel to the sets of columns which form vertically aligned pages.

Row decoder 12 receives its inputs directly from the output of an input buffer circuit, generally designated C. Column decoder 14 receives its inputs from page decoder 16 which, in turn, is connected to the output of a random access memory, generally designated D. RAM D is connected by means of parallel lines 18 to data transfer circuit B so as to receive the bits of the page address signal therefrom. It is also connected to the output of input buffer circuit C and to the output of a gate 20. Gate 20 receives, as one input, a command (write enable) signal ($\overline{WE}$) from an input function decoder circuit, generally designated E. The output of the function generator E is also connected to decoder 16. The other input of gate 20 is the Chip Enable ($\overline{CE}$) signal which is an input to input buffer circuit C, which is also connected to the power down circuitry 22 of conventional design. Gate 20 causes all of the storage devices in the non-selected pages of ROM A to be in the low power mode. Circuit 22 controls the power status of other circuits in the system.

Input buffer circuit C has, for example, seventeen address inputs denoted $A_0 \ldots A_{16}$. It is also has an input to receive the Chip Enable ($\overline{CE}$) signal and an input to receive the command signal which is the Write Enable signal ($\overline{WE}$) from the microprocessing unit. The input buffer circuit C is mask programmable to block the path of selected ones of the address inputs $A_0 \ldots A_{16}$, depending upon the page configuration. Only input buffer circuit C and decoder 16 need be mask programmed to define the page configuration of ROM A. All other components are identical, regardless of the page configuration.

An output of input function decoder E is connected to a chip select circuit, generally designated F, which, in turn, is connected to data transfer circuit B. The chip select circuit F controls the data transfer circuit B to permit the page address signal on data bus 10 to be transferred to lines 18 in the presence of the command signal $\overline{WE}$.

In order to obtain the page configuration illustrated in FIG. 1, that is, eight pages, each having 128K bits of memory, decoder 16 is mask programmed to form a conventional 3:8 decoder, the three inputs being the three bits of the page address signal ($P_0$, $P_1$, $P_2$) which are present on data bus 10 and routed through data transfer circuit B by means of parallel lines 18 to RAM D. RAM D is a slow set up/hold RAM employed to insure temporary storage of the page address signal, which is generated by the system during the presence of the command signal $\overline{WE}$. RAM D will retain the page address signal until the rising edge of the next $\overline{WE}$ signal. The $\overline{WE}$ signal and the page address signal ($P_0$, $P_1$, $P_2$) are generated by the microprocessing unit of the system in which the ROM circuit of the present invention is employed.

Input buffer circuit C is mask programmed such that the paths of three of the address inputs, designated $A_{14}$, $A_{15}$, $A_{16}$ are blocked. Thus, input buffer circuit C passes only address inputs $A_0$-$A_{13}$ to the decoders. $A_0$-$A_{10}$ are provided as inputs to row decoder 12. $A_{11}$-$A_{13}$ are provided as inputs to RAM D, are routed through decoder 16, and along with the output of decoder 16, form the inputs to column decoder 14. The output of column decoder 14 causes the selection of the appropriate page and the appropriate column in that page. In conjunction with the output of row decoder 12, the appropriate location of the selected page is accessed and the data therein fed to data transfer circuit B.

In order to alter the circuit for a four-page configuration, each page having 256K bits, decoder 16 is mask programmed into two separate conventional decode circuits, a 1:2 decoder 16a, and a 2:4 decoder 16b. In this case, only a two-bit page address signal ($P_0$; $P_1$) is required. The 2-bit page address signal passes through RAM D and is provided as the input to the 2:4 decoder 16b. This configuration is illustrated in FIG. 2.

Input buffer circuit C is mask programmed to block the paths of address inputs $A_{15}$ and $A_{16}$ only. Unlike the previous example, the path of address input $A_{14}$ is not blocked. Inputs $A_0$-$A_{14}$ are routed to the decoders, with inputs $A_0$-$A_{10}$ being applied to row decoder 12 and inputs $A_{14}$-$A_{14}$ providing an input for RAM D. Input $A_{14}$ is routed to the 1:2 decoder 16a and is used to select the "A" or "B" section of the selected one of four pages denoted as 0, 1, 2, and 3. The output of decoder 16a and decoder 16b, along with inputs $A_{11}$-$A_{13}$, are provided as inputs to column decoder 14. The outputs of decoder 14, in conjunction with the outputs of row decoder 12, serve to select the appropriate page, the appropriate page section, the appropriate column, and the appropriate row of the location to be accessed.

As illustrated in FIG. 3, the circuit of the present invention can also be mask programmed for use as a single page ROM having 1 KK bits. No paging is required to access any data, as all locations are directly accessible. In this case, no paging signal is provided on data bus 10 and, thus, none is transferred to RAM D. All of the addressed inputs $A_0$-$A_{16}$ to the input buffer are used and all are transferred to the decoders. Inputs $A_0$-$A_{10}$ are provided to row decoder 12 and inputs $A_{11}$-$A_{16}$ are provided to RAM D. RAM D is never enabled, it simply functions to transfer inputs $A_{11}$-$A_{16}$ to decoder 16, which is a conventional 3:8 decoder.

Inputs $A_{14}$, $A_{15}$, and $A_{16}$ form the three inputs to decoder 16. The other inputs $A_{11}$-$A_{13}$, along with the output of decoder 16, are provided as inputs to column decoder 14. Column decoder 14, in conjunction with row decoder 12, directly accesses the particular storage unit desired. The command signal ($\overline{WE}$) has no effect on the circuit as the circuit functions as a standard ROM without pagination.

It will now be appreciated that the circuit of the present invention can be adapted for use in a variety of different pagination modes by mask programming the peripheral circuitry, including the address decoder and input buffer circuit. The address decoder is mask programmed to form a selected one of conventional decoder configurations. The input buffer circuitry is mask programmed to block selected address input paths. This enables the circuit of the present invention to be used in a variety of pre-existing systems having fixed numbers of address inputs by adapting the system to generate the necessary page address signal on the data bus in the presence of the write enable command.

Aside from the mask programmability of its page configuration, the ROM circuit of the present invention is unique in that the data transfer circuit, aside from the usual data output function, also provides entrance for the page address signal and routes same to the decoder through a temporary storage circuit. The presence of the temporary storage circuit, in the form of a latch, preferably a random access memory, is in itself novel on a ROM circuit, as conventional ROM circuits have no facility for temporarily storing address signals. Such storage is required in the present invention such that page selection can be maintained as various locations within a particular page are accessed.

While only a single preferred embodiment of the present invention has been disclosed herein for purposes of illustration, it is obvious that many variations and modifications could be made thereto. It is intended to cover all of these variations and modifications which fall within the scope of the present invention, as defined by the following claims:

I claim:

1. A method of manufacturing an increased memory capacity read only memory (ROM) chip for universal replacement of smaller capacity ROM chips in different pre-existing systems regardless of differences in the number of address input signals for accessing the ROM required by the different pre-existing systems, the method comprising the steps of:

fabricating a ROM circuit on the chip to provide a matrix array of addressable data storage locations, fabricating peripheral circuitry on the chip including
an address buffer to accept row/column storage location address input signals associated with a predetermined one of the pre-existing systems by which individual ones of data storage locations organized in rows and columns in the smaller capacity ROM chip to be replaced are addressed by said predetermined one of the pre-existing systems for selectively accessing the data stored therein, the address buffer being configurable by mask programming to accommodate differences in the number of storage location address input signals required among the different pre-existing systems, and an address decoder configurable by mask programming to organize the matrix array of the ROM circuit into a page configuration of one page constituting the entire matrix array or of multiple pages constituting sub-arrays in the form of selectively different sized subdivisions of the entire matrix array of the ROM circuit, to accept page address input signals derived at least in part from said storage location address input signals by which individual ones of the pages are addressed to select the page containing the storage location of the data selected to be accessed, and mask programming the address buffer to accommodate the specific number of storage location address input signals required by said predetermined one of the pre-existing systems, and mask programming the address decoder to organize the matrix array of the ROM circuit into a page configuration suitable to permit selective accessing of data in storage locations corresponding to those of the smaller capacity ROM chip to be replaced and also to permit selective accessing of the additional data storage locations associated with the increased memory capacity of the ROM circuit.

2. The method of claim 1, further including fabricating as part of said peripheral circuitry a separate storage means to receive and temporarily store the page address input signal for application to the address decoder to maintain the page selection as data within storage locations on the selected page are being accessed.

3. The method of claim 2, including fabricating said separate storage means as a random access memory (RAM).

4. The method of claim 1, including mask programming the address buffer to block predetermined signal paths thereof as the way to accommodate said specific number of storage location address input signals.

5. A method of producing large capacity read only memory (ROM) chips for universal replacement of relatively smaller capacity ROM chips having data storage devices organized in a matrix of rows and columns, within various preexisting systems having differences in number of row/column address signals required to selectively access data in the storage devices of the ROM, comprising the steps of:

fabricating a multiplicity of substantially identical mask programmable ROM circuit chips, each having a matrix of addressable data storage devices, and each also having address buffers and an address decoder to selectively access data in desired ones of the storage devices, mask programming the address buffers of each of said chips to accommodate a respective number of address signals according to the number required by selected ones of the pre-existing systems in which smaller capacity ROM chips are to be replaced, and mask programming the address decoder of each of said chips to organize the respective matrix thereof into page configurations constituting page address-selectable single or multiple pages into which the matrix is divided to permit selective accessing of data in storage devices corresponding to those of the respective smaller capacity ROM chip to be replaced as well as selective accessing of the additional storage devices associated with the larger capacity of the replacement ROM chip.

6. The method of claim 5, further including fabricating as part of each of said ROM circuit chips a separate storage means to receive and temporarily store a page address for application to the address decoder of the respective chip to maintain the selected page for continued accessing of data within storage devices on that page.

7. The method of claim 6, including fabricating said separate storage means as a random access memory (RAM).

8. The method of claim 5, including mask programming the address buffers of each of the ROM circuit chips to block or leave available predetermined signal paths of the respective address buffers as the way to accommodate the respective number of address signals required by said selected ones of the pre-existing systems.

* * * * *